United States Patent [19]
Singer et al.

[11] Patent Number: 5,909,131
[45] Date of Patent: Jun. 1, 1999

[54] LOW-DISTORTION TECHNIQUE TO BANDLIMIT A SWITCHED-CAPACITOR SAMPLING CIRCUIT

[75] Inventors: Lawrence A. Singer, Bedford; Todd L. Brooks, Boston, both of Mass.

[73] Assignee: Analog Devices, Inc., Norwood, Mass.

[21] Appl. No.: 08/695,823

[22] Filed: Jul. 31, 1996

[51] Int. Cl.$^6$ .................................................. G11C 27/02
[52] U.S. Cl. ................................................. 327/91; 327/96
[58] Field of Search .................... 327/91, 98, 94, 327/95, 96, 52, 54, 337, 556; 341/122; 330/9

[56] References Cited

U.S. PATENT DOCUMENTS

| | | | |
|---|---|---|---|
| 4,455,539 | 6/1984 | Wurzburg | 327/554 |
| 5,206,543 | 4/1993 | Takita et al. | 327/91 |
| 5,391,999 | 2/1995 | Early et al. | 327/554 |
| 5,517,140 | 5/1996 | Hatsuda | 327/91 |
| 5,585,756 | 12/1996 | Wang | 327/337 |

OTHER PUBLICATIONS

Analog Devices, Inc., "Complete 12–Bit, 10 MSPS Monolithic A/D Converter," AD9220 Product Description, 1995, 20 pgs.

*Primary Examiner*—My-Trang Nu Ton
*Attorney, Agent, or Firm*—Wolf, Greenfield & Sacks, P.C.

[57] ABSTRACT

In a switched-capacitor input sampling structure, a resistor connected in series with the input structure, but after the output of the input switch limits the noise bandwidth of the input structure. The selected placement of the resistor does not appreciably limit the slewing or settling time of downstream circuit elements, resulting in a low noise bandwidth, high speed system.

35 Claims, 14 Drawing Sheets

LOW-DISTORTION TECHNIQUE TO BANDLIMIT A SWITCHED-CAPACITOR SAMPLING CIRCUIT

BACKGROUND

1. Field of the Invention

The invention relates to input structures for switched-capacitor circuits. More particularly, the invention relates to switched-capacitor input circuits for limiting input noise. Yet more particularly, the invention relates to input structures for switched-capacitor circuits which limit input noise while not appreciably distorting the sampled input signal and without degrading the settling time of circuits downstream of the input structure.

2. Related Art

Representative conventional switched-capacitor input structures are illustrated schematically in FIGS. 1 and 2. In both of these conventional switched-capacitor input structures, an input voltage $V_{IN}$ is sampled onto. An input capacitor $C_{IN}$ through switch $S_{IN}$ during a first input phase. During a second input phase, switch $S_{IN}$ changes state to disconnect the input voltage $V_{IN}$ from capacitor $C_{IN}$. Either the charge or the voltage accumulated on capacitor $C_{IN}$ is then transferred from the input capacitor $C_{IN}$ to a next stage of circuitry (not shown). In each of the circuits of FIGS. 1 and 2, the switch $S_{SAMPLE}$ also switches state when the input structure switches between the first phase, referred to hereinafter as the sampling phase, and the second phase, referred to hereinafter as the hold phase. During the sample phase, switch $S_{SAMPLE}$ is in a conductive state, while during hold phase, switch $S_{SAMPLE}$ is in a substantially non-conductive state. Another switch $S_H$ connects the input side of $C_{IN}$ to a bias voltage $V_H$ during hold phase and is substantially non-conducting during sample phase. Switches $S_{IN}$, $S_H$ and $S_{SAMPLE}$ are controlled by a sampling clock (not shown). The clock signal may be connected to gate terminals of MOS transistors forming the switches.

In the circuit of FIG. 1 the voltage $V_{IN}$ is sampled with respect to a bias voltage $V_B$. In the circuit of FIG. 2 $V_{IN}$ is sampled with respect to the offset voltage of op amp AMP, which will facilitate offset compensation of op amp AMP. When $S_{SAMPLE}$ is in a substantially conducting state, i.e., sample phase, op amp AMP is connected in a unity gain configuration. Thus, any input offset voltage is subtracted from the voltage transferred to capacitor $C_{IN}$. In this configuration, the input offset error voltage of op amp AMP is compensated because the inverting input of op amp AMP remains connected to input capacitor $C_{IN}$ when switch $S_{SAMPLE}$ is in a substantially non-conducting state, i.e., during hold phase. The input offset voltage previously subtracted from the voltage transferred is thus added back in during hold phase, fully compensating for the input offset voltage.

One important characteristic of these input structures is bandwidth. Components downstream of the input structures are usually required to have extremely wide bandwidths, in order to slew and settle quickly. For example, in the sample phase, sample and hold circuits or sigma-delta modulators are required to accurately track variations in the input signal. In addition, in hold phase, these circuits are required to settle rapidly. The input structure illustrated in FIG. 1 has a dominant pole at $$\omega_A = \frac{1}{\tau_A} = \frac{1}{(R_{SWITCH} + R_{SAMPLE})C_S}.$$

The resistance $R_{SWITCH}$ is the ON resistance of switch $S_{IN}$, while the resistance $R_{SAMPLE}$ is the ON resistance of switch $S_{SAMPLE}$. Capacitance $C_S$ is the value of capacitor $C_{IN}$. The dominant pole of the circuit of FIG. 2 occurs at $$\omega_B = \frac{1}{\tau_B} = \frac{1}{\left(R_{SWITCH} + \frac{1}{G_M}\right)C_S}.$$

In the definition of $\tau_B$, $R_{SWITCH}$ and $C_S$ are defined as above, while $G_M$ is the transconductance of op amp AMP. As an example, for a switched capacitor input on a 12-bit analog-to-digital (A/D) converter sampling at a 10MHz rate, typical values achievable for the various components and typical target dominant pole frequencies are given in the table below.

TABLE 1

| | Value |
|---|---|
| $R_{SWITCH}$ | 10–50 Ω |
| $R_{SAMPLE}$ | 100–500 Ω |
| $C_S$ | 1–10 pF |
| $G_M$ | 1–10 mA/V |
| $\omega_A$ | 20–400 MHz |
| $\omega_B$ | 20–400 MHz |

In these prior art circuits, if the input voltage is noisy, then that noise is sampled by the input capacitor. Given a wide bandwidth system, the input noise is not significantly limited. Systems for certain applications require wide bandwidth for good distortion performance in the sample phase. In addition, systems typically are designed to have a bandwidth wide enough so that the system settles quickly enough during hold phase to suit a particular application. As a result, input noise may be sampled into the system, if not in some way limited or prevented from being present at the input. Sources of input noise can include thermal noise of a source circuit that drives the input voltage $V_{IN}$ or noise from unrelated circuits coupling into the input voltage $V_{IN}$.

In prior art circuits such as FIGS. 1 and 2, there is a tradeoff between noise and distortion depending on the value of $R_{SWITCH}$. When the resistance $R_{SWITCH}$ of switch $S_{IN}$ is large, the bandwidth of the system is small and the system may not settle quickly enough. When $R_{SWITCH}$ is small, the bandwidth of the system is large, and noise coupling may be introduced from the input voltage. The nominal value of $R_{SWITCH}$ is a design parameter set by the designer, but the actual value of $R_{SWITCH}$ during circuit operation varies substantially with the input voltage, $V_{IN}$, producing distortion due to the input transfer function being non-linear. Typical prior art systems operating on an input signal having a spectral bandwidth of between 20 and 40 megahertz may have a bandwidth of approximately 400 megahertz to accommodate settling time requirements. However, the noise bandwidth of a system designed to the parameters described above is unacceptably large.

FIG. 3 schematically illustrates an example of a differential prior-art switched-capacitor input structure which samples an input voltage onto input capacitors $C_{INP}$ and $C_{INM}$ during the sample phase. The input voltage is impressed across the input terminals $V_{INP}$ and $V_{INM}$. The embodiment of FIG. 3 includes a differential sample switch $S_{SAMPLE}$ which connect capacitors $C_{INP}$ and $C_{INM}$ together during the sample phase and also includes two additional switches, $S_{SAMPLEP}$ and $S_{SAMPLEM}$, which connect capacitors $C_{INP}$ and $C_{INM}$ to bias voltage $V_B$ during the sample phase. Two switches, $S_{HP}$ and $S_{HM}$, are turned on during the hold phase to charge the input terminals of capacitors $C_{INP}$ and $C_{HM}$ to $V_{HP}$ and $V_{HM}$. In some implementations of this prior-art circuit, $V_{HP}$ and $V_{HM}$ may be at substantially the same potential. FIG. 4 illustrates another prior-art switched-capacitor input structure which is similar to the embodiment of FIG. 3. The embodiment of FIG. 4 differs from that of FIG. 3 in that a single switch, $S_H$, is used in place of the two switches, $S_{HP}$ and $S_{HM}$, of the embodiment of FIG. 3. This single switch, $S_H$, forces the input terminals of capacitors $C_{INP}$ and $C_{INM}$ to the same potential during hold phase by connecting them together.

FIG. 5 illustrates another prior-art differential switched-capacitor input structure. The circuit of FIG. 5 includes sample switches $S_{SAMPLEP}$ and $S_{SAMPLEM}$ which connect the amplifier AMP in unity-gain configuration during the sample phase in order to charge the input capacitors with respect to the offset voltage of the amplifier AMP. This allows offset compensation of the amplifier. Two switches, $S_{HP}$ and $S_{HM}$, are turned on during the hold phase to charge the input terminals of capacitors $C_{INP}$ and $C_{INM}$ to $V_{HP}$ and $V_{HM}$. In some implementations of this prior-art circuit, $V_{HP}$ and $V_{HM}$ may be at substantially the same potential. FIG. 6 illustrates another differential embodiment of a prior-art switched-capacitor input structure which is similar to the embodiment of FIG. 5. The embodiment of FIG. 6 differs from that of FIG. 5 in that a single switch, $S_H$, is used in place of the two switches, $S_{HP}$ and $S_{HM}$, of the embodiment of FIG. 5. This single switch, $S_H$, forces the input terminals of capacitors $C_{INP}$ and $C_{INM}$ to the same potential during hold phase by connecting them together.

FIGS. 7 and 8 schematically show prior art solutions to the noise coupling problems associated with FIG. 1. In FIG. 7, resistor $R_{EXT}$ is added between the input voltage source and switch $S_{IN}$. Resistor $R_{EXT}$ is much larger than the resistance of switch $S_{IN}$ and therefore dominates the input resistance. Thus, the external resistance dominates the pole $\omega_A$. However, non-linearities continue to plague the prior art systems.

The solution of FIG. 8 adds an external resistor $R_{EXT}$ and external capacitor $C_{EXT}$. By setting the values of the external capacitor and external resistor appropriately, the location of the pole $\omega_B$ can be set to suit a particular application. Here also, non-linearity plagues the system.

The drawbacks associated with the solutions of FIGS. 7 and 8 relate to the fact that when the external resistance is added upstream of the input switch $S_{IN}$ the non-linear parasitic capacitances of the input switch become problematic. In other words, the non-linear parasitic capacitances of the input switch cause distortion. Typically the input switch $S_{IN}$ is implemented as an MOS transmission gate switch. FIG. 9 schematically represents the input structure, showing some of the parasitic capacitances of a MOS-implemented transmission gate switch $S_{IN}$ that cause non-linear behavior and distortion with the addition of the external resistance.

SUMMARY OF THE INVENTION

The present invention solves the problems identified in the conventional structures discussed above, as well as addressing such other problems and goals as will be apparent to those skilled in this art, by locating a bandwidth limiting resistor in the switched capacitor input structure downstream of an input sampling switch and upstream of circuits which receive the sampled signal from the switched capacitor. By locating additional resistances in accordance with the various aspects of the present invention, noise bandwidth is reduced without distorting the signal sampled on the input capacitor.

The present invention may be embodied as a switched capacitor input sampling structure having an output, comprising: an input switch having an input and an output; an input capacitor having a first plate connected to receive a signal from the output of the input switch and having a second plate connected to the output of the input sampling structure; and a resistor connected in series with the input structure, after the output of the input switch. Numerous variations are possible, in which a resistance is located in or distributed amongst one or more different portions of the input signal path. Further variations are possible in configurations for the biasing switches which bias the input or output side of the input capacitor during different phases of the operation of the input structure.

For example, the structure recited above, having a sample phase and a hold phase, may further comprise: a first biasing switch connected between the first plate of the input capacitor and a first biasing signal, the first biasing switch conducting during the hold phase and substantially non-conducting during the sample phase; wherein the input switch is conducting during the sample phase and substantially non-conducting during the hold phase. In a further variation, there is provided an op amp having an inverting input connected to receive a voltage from the second plate of the input capacitor and having an output; and a sampling switch connected between the output of the op amp and the inverting input of the op amp, the sampling switch conducting during the sample phase and substantially non-conducting during the hold phase. In yet another variation, there is provided a sampling switch connected to bias the second plate of the input capacitor to a second biasing voltage when the sampling switch is conducting, the sampling switch conducting during the sample phase and substantially non-conducting during the hold phase. In a variation having a specific resistor placement, the resistor is disposed in a branch of the structure in series between the output of the input sampling structure and the sampling switch. In another variation having a specific resistor placement, the resistor is disposed in a branch of the structure in series between the input switch and the first plate of the input capacitor. Finally, the structure may further comprise a second biasing switch, substantially larger than the first biasing switch, connected between the output of the input switch and the first biasing signal, the second biasing switch conducting during the hold phase and substantially non-conducting during the sample phase.

In a differential switched capacitor input sampling structure having a differential output, having a first branch and a second branch, the first and second brances may comprise corresponding ones of: first and second input switches, each having an input and an output; first and second input capacitors, each having a first plate connected to receive a signal from the output of a corresponding one of the first and second input switches and each having a second plate, the second plates of the first and second input capacitors forming the differential output; and first and second resistors, each connected in series with corresponding ones of the first and second branches. A variation of this structure, having a sample phase and a hold phase, may further comprise: a biasing switch connected between the first plate of the first input capacitor and the first plate of the second input capacitor, the biasing switch conducting during the hold phase and substantially non-conducting during the sample phase; wherein the input switch is conducting during the sample phase and substantially non-conducting during the hold phase. This structure may further comprise: an op amp having an inverting input connected to receive a voltage from the second plate of the first input capacitor, having a non-inverting input connected to receive a voltage from the second plate of the second input capacitor, having a non-inverting output and having an inverting output; a first sampling switch connected between the non-inverting output of the op amp and the inverting input of the op amp, the first sampling switch conducting during the sample phase and substantially non-conducting during the hold phase; and a second sampling switch connected between the inverting output of the op amp and the non-inverting input of the op amp, the second sampling switch conducting during the sample phase and substantially non-conducting during the hold phase. This structure may include variations with specific placement of resistors, such as wherein the first and second resistors are disposed in branches of the structure in series between corresponding outputs of the input sampling structure and corresponding sampling switches, or wherein the first and second resistors are disposed in branches of the structure in series between corresponding first and second input switches and the first plate of corresponding input capacitors. The structure may be further varied by including a second biasing switch, substantially larger than the first biasing switch, connected between the output of the first input switch and the output of the second input switch, the second biasing switch conducting during the hold phase and substantially non-conducting during the sample phase.

In a differential switched capacitor input sampling structure having a differential output, having a first branch and a second branch, the first and second branches may comprise corresponding ones of: first and second input switches, each having an input and an output; first and second input capacitors, each having a first plate connected to receive a signal from the output of a corresponding one of the first and second input switches and each having a second plate, the second plates of the first and second input capacitors forming the differential output; first and second sampling switches connected to bias the second plate of corresponding ones of the first and second input capacitors each to a biasing signal when the first and second sampling switches are conducting, the first and second sampling switches conducting during the sample phase and substantially non-conducting during the hold phase; and first and second resistors, each connected in series with corresponding ones of the first and second branches. Finally, this structure may be varied by providing first and second biasing switches connected respectively between the first plate of the first and second input capacitors and first and second biasing signals, the biasing switch conducting during the hold phase and substantially non-conducting during the sample phase.

Other variations will be apparent to those skilled in this art.

BRIEF DESCRIPTION OF THE DRAWINGS

In the drawings in which like reference designations indicate like elements.

DETAILED DESCRIPTION

The present invention will now be better understood upon reading in connection with the figures the following detailed description of illustrative embodiments thereof.

Figure 1:
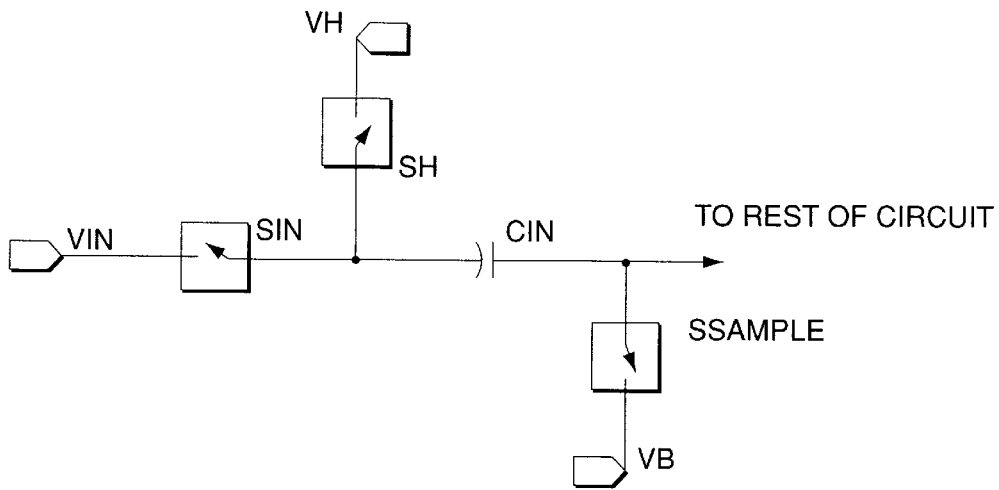
FIG. 1 is a schematic representation of a conventional, single-ended switched-capacitor input structure.
Figure 10:
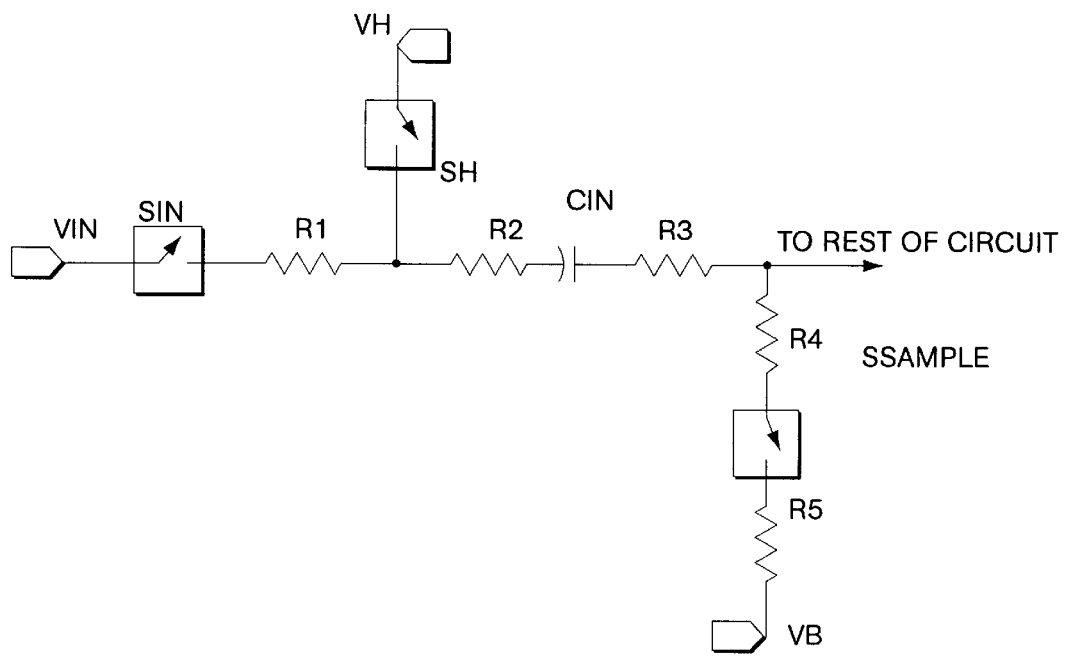
FIGS. 10, 11, 12 and 13 are schematic representations of input structures according to various aspects of the invention, embodied in structures where input sampling is performed relative to a bias voltage $V_B$.

FIG. 10 illustrates one embodiment of the invention. As seen in the schematic representation of FIG. 10, the circuit of FIG. 10 has five branches indicated by resistors R1–R5, in which a resistance may be introduced to produce band-limiting in accordance with various aspects of the invention. Any one or more of the five resistors R1–R5 may have a non-zero value, and up to four of the five resistors R1–R5 may have a zero value, i.e. be essentially not present. The primary advantage of this invention over the prior art shown in FIG. 1 is that the bandlimiting resistance interacts only with the linear capacitor $C_{IN}$, and not with the nonlinear parasitic capacitances of the input switch $S_{IN}$. As discussed previously, the bandlimiting resistance in the prior art circuit of FIG. 1 precedes switch $S_{IN}$ and therefore interacts with the nonlinear parasitics of $S_{IN}$. This results in distortion of the voltage across the input capacitor $C_{IN}$. The present invention avoids this interaction by placing the bandlimiting resistance after the input switch $S_{IN}$. Therefore, the voltage across the input capacitor $C_{IN}$ remains undistorted.

It should be appreciated that switch $S_H$ also has nonlinear parasitics that can contribute to distortion. Specifically, the nonlinear parasitic capacitances of switch $S_H$ can interact with resistor R1 to cause distortion in the voltage across capacitor $C_{IN}$ during the sample phase. Therefore, either resistor R1 should be kept small or the nonlinear parasitic capacitances of switch $S_H$ should be minimized, i.e. the devices used to implement switch $S_H$ should be kept small.

It should be also appreciated that when the circuit is configured in hold phase, capacitor $C_{IN}$ is charged to $V_H$ through switch $S_H$ and charge is transferred through resistors R2 and R3 to the rest of the circuit (not shown). Therefore to minimize the hold settling time, it is desirable to keep R2 and R3 as small as possible. Furthermore, during hold phase, the parasitic capacitances of switch $S_{IN}$ must be charged to $V_H$ through switch $S_H$ and resistor R1. Therefore, for the additional reason of minimizing the hold settling time, it is desirable to keep R1, in addition to R2 and R3, as small as possible. This may be accomplished by bandlimiting primarily with resistors R4 and R5, i.e. using larger values of resistance for R4 and R5, in situations where hold settling time is important.

Figure 11:
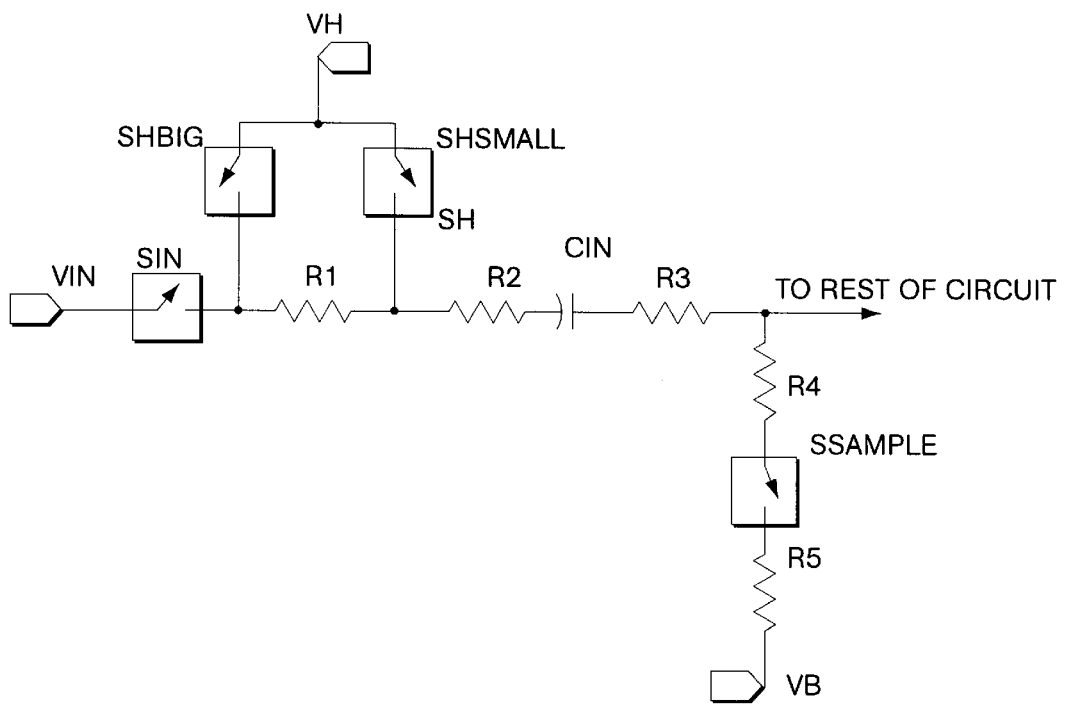

FIG. 11 illustrates another embodiment of the present invention which is useful in situations where hold settling time is important. This embodiment also reduces the distortion caused by the interaction of resistor R1 and the nonlinear parasitic capacitances of switch $S_H$ of FIG. 10. The switch $S_H$ in the circuit of FIG. 10 has been divided into two switches, $S_{HBIG}$ and $S_{HSMALL}$. Switch $S_{HBIG}$ provides rapid charging of the parasitic capacitances of switch $S_{IN}$ during the hold phase. Similarly, switch $S_{HSMALL}$ permits the rapid charging of $C_{IN}$ to $V_H$ and the transfer of charge from $C_{IN}$ to the rest of the circuit (not shown). The devices used to implement switch $S_{HSMALL}$ should be kept small to minimize nonlinear parasitic capacitances and avoid distortion caused by the interaction of resistor R1 and the parasitic capacitances of switch $S_{HSMALL}$ during sample phase.

Figure 3:
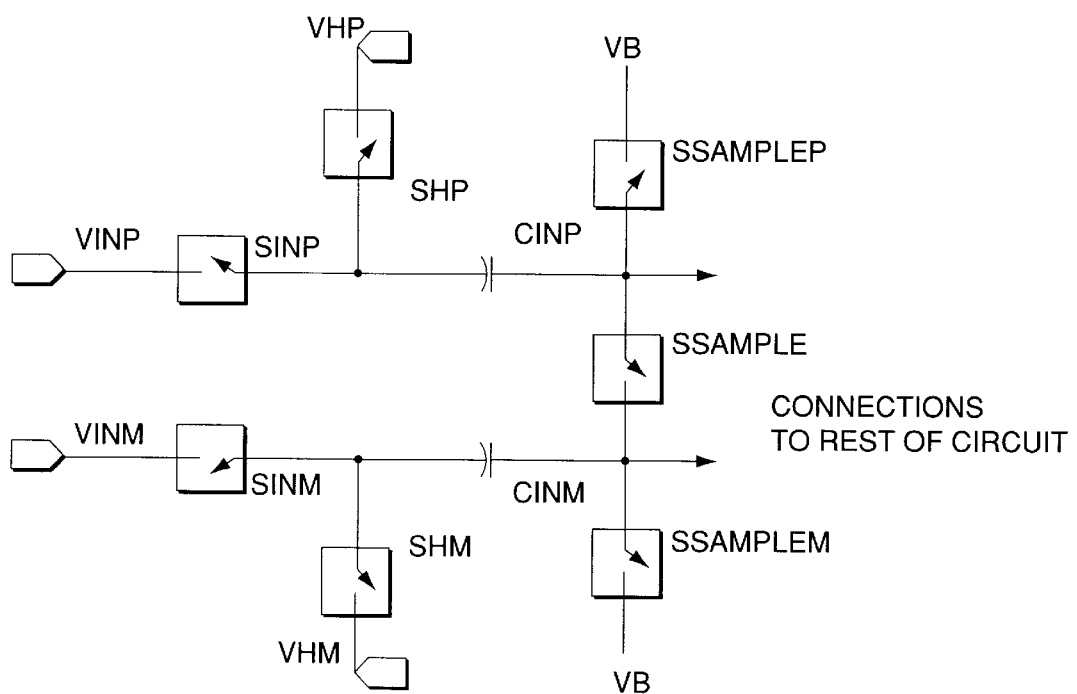
FIG. 3 is a schematic representation of a conventional, differential switched-capacitor input structure similar to the single-ended structure of FIG. 1.
Figure 4:
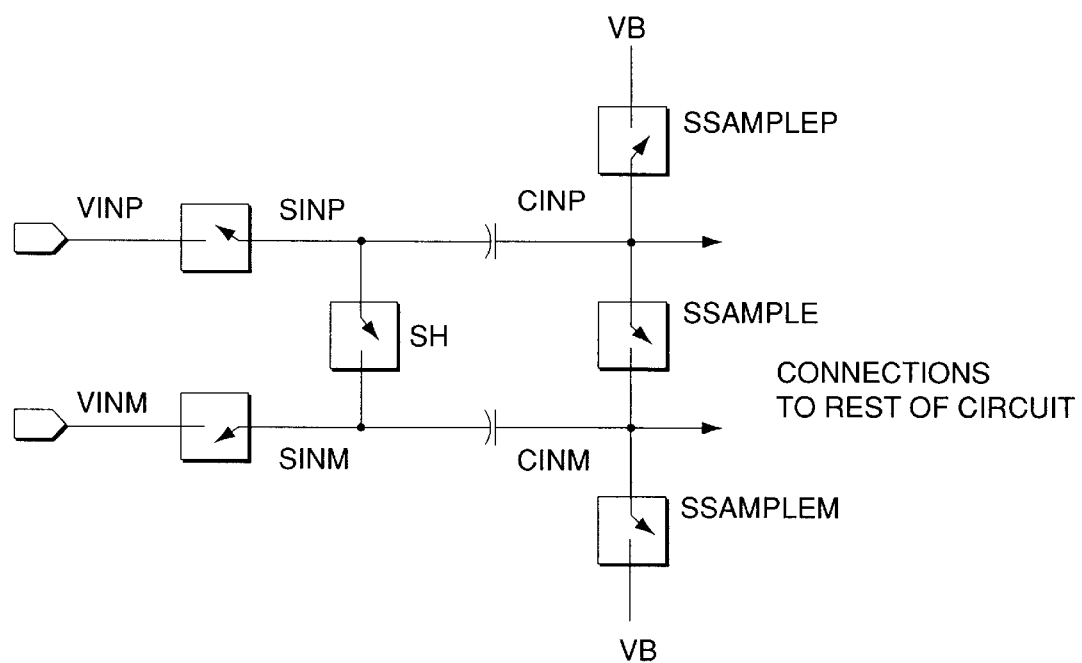
FIG. 4 is a schematic representation of an alternate conventional, differential switched-capacitor input structure.
Figure 12:
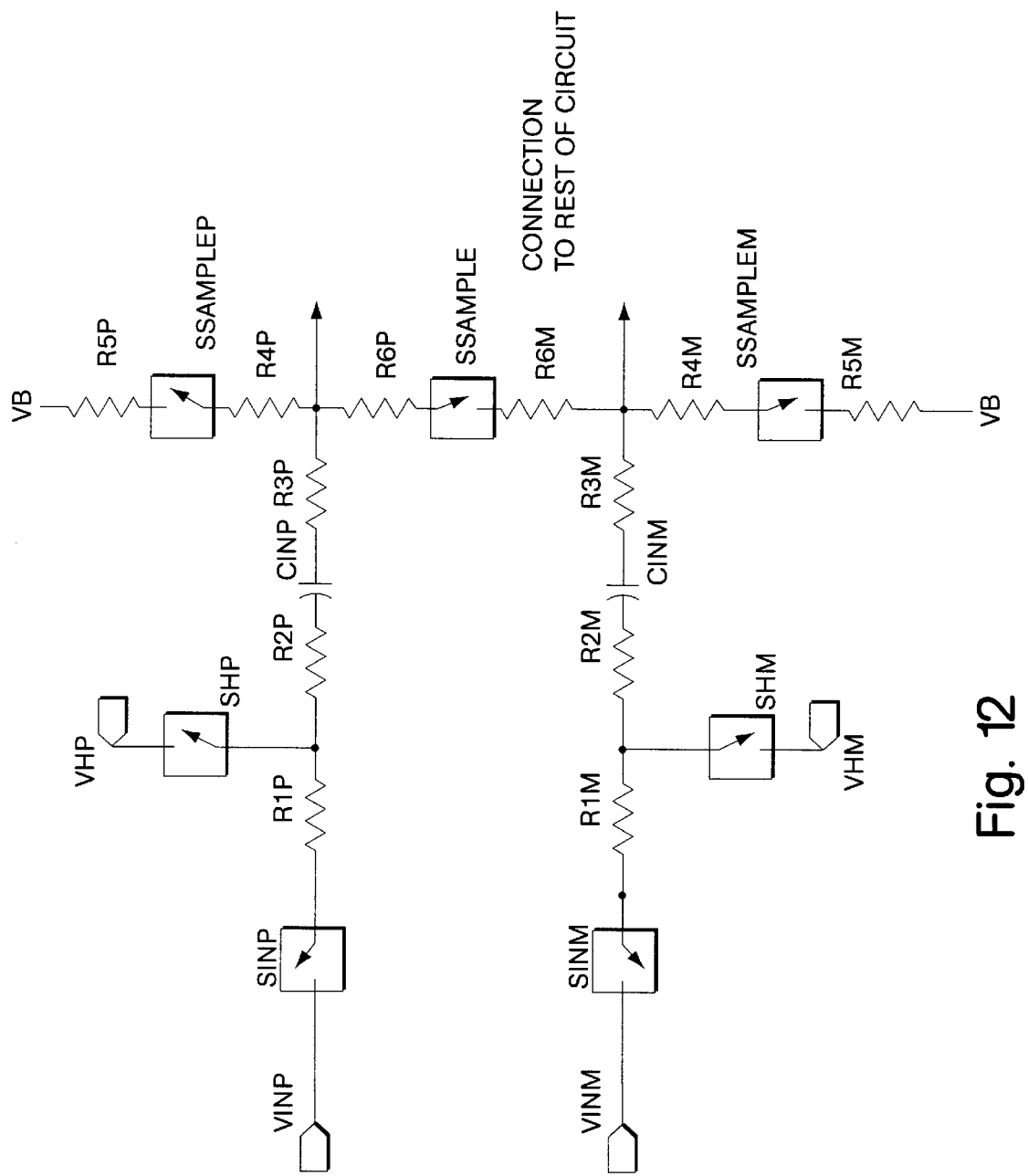
Figure 13:
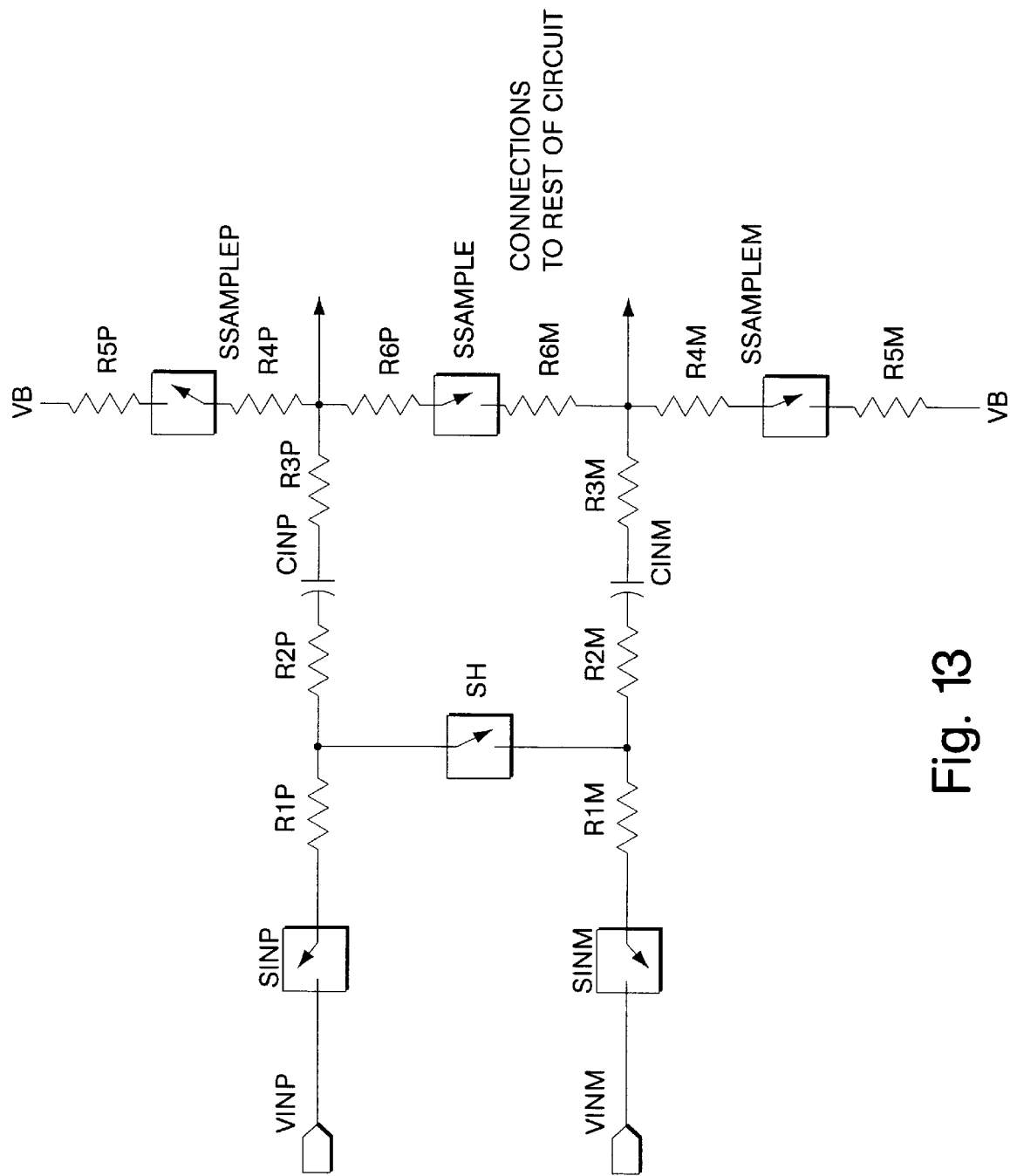

FIG. 12 and 13 illustrate differential embodiments of the invention. FIG. 12 corresponds to prior art FIG. 3, and FIG. 13 corresponds to prior art FIG. 4. Resistors R1P–R6P and R1M–R6M of FIG. 12 and 13 illustrate how bandlimiting resistance can be added to the prior art circuits in FIG. 3 and FIG. 4 to implement various differential embodiments of the present invention. Resistors R6P and R6M in FIG. 12 and 13 bandlimit the differential noise of the input signal while resistors R1P–R5P and R1M–R5M bandlimit both the differential noise and the common-mode noise.

Figure 14:
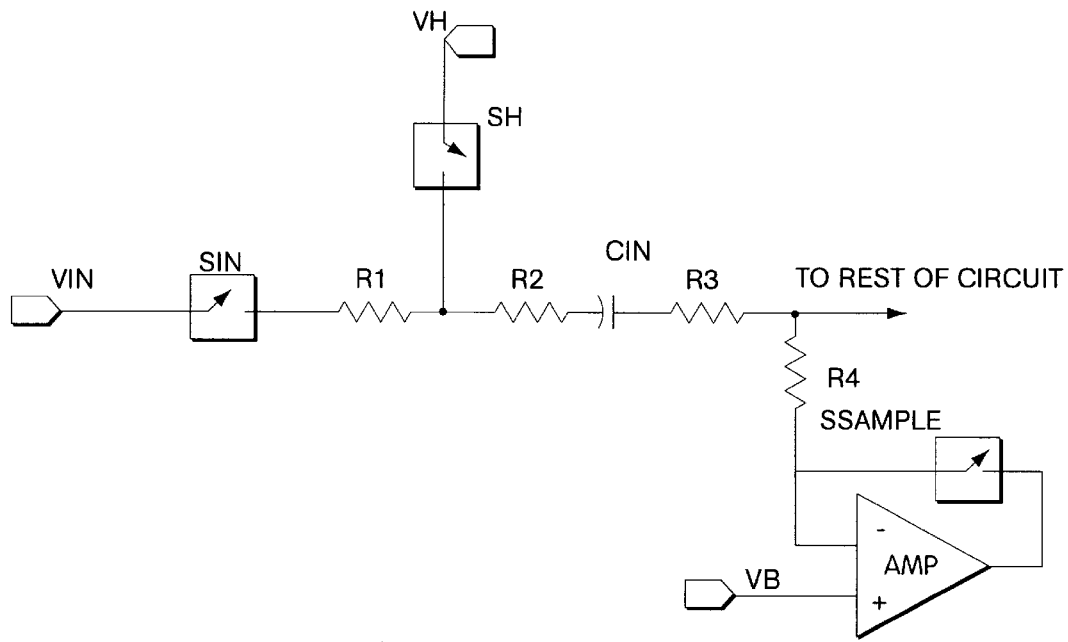
FIGS. 14, 15, 16, 17, 18 and 19 are schematic representations of input structures according to various aspects of the invention, embodied in structures where input sampling is performed relative to a virtual ground formed at the input to an op amp.

FIG. 14 illustrates another embodiment of the invention. As seen in the schematic representation of FIG. 14, the circuit of FIG. 14 has four branches indicated by resistors R1–R4, in which a resistance may be introduced to produce bandlimiting in accordance with various aspects of the invention. Any one or more of the four resistors R1–R4 may have a non-zero value, and up to three of the four resistors R1–R4 may have a zero value, i.e. be essentially not present.

Figure 2:
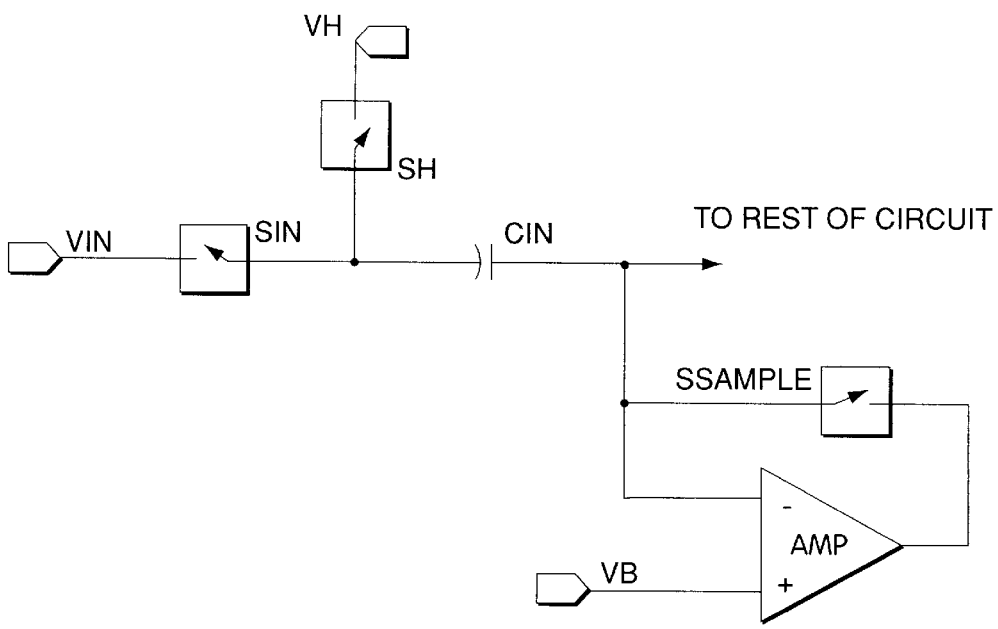
FIG. 2 is a schematic representation of an alternate conventional, single-ended switched-capacitor input structure.

The primary advantage of this invention over the prior art shown in FIG. 2 is that the bandlimiting resistance interacts only with the linear capacitor $C_{IN}$, and not with the nonlinear parasitic capacitances of the input switch $S_{IN}$. As discussed previously, the bandlimiting resistance in the prior art circuit of FIG. 2 precedes switch $S_{IN}$ and therefore interacts with the nonlinear parasitics of $S_{IN}$. This results in distortion of the voltage across the input capacitor $C_{IN}$. The present invention avoids this interaction by placing the bandlimiting resistance after the input switch $S_{IN}$. Therefore, the voltage across the input capacitor $C_{IN}$ remains undistorted.

It should be appreciated that switch $S_H$ also has nonlinear parasitics that can contribute to distortion. Specifically, the nonlinear parasitic capacitances of switch $S_H$ can interact with resistor R1 to cause distortion in the voltage across capacitor $C_{IN}$ during the sample phase. Therefore, either resistor R1 should be kept small or the nonlinear parasitic capacitances of switch $S_H$ should be minimized, i.e. the devices used to implement switch $S_H$ should be kept small.

It should be also appreciated that when the circuit is configured in hold phase, capacitor $C_{IN}$ is charged to $V_H$ through switch $S_H$ and charge is transferred through resistors R2 and R3 to the rest of the circuit (not shown). Therefore to minimize the hold settling time, it is desirable to keep R2 and R3 as small as possible. Furthermore, during hold phase, the parasitic capacitances of switch $S_{IN}$ must be charged to $V_H$ through switch $S_H$ and resistor R1. Therefore to minimize the hold settling time it also desirable to keep R1, in addition to R2 and R3, as small as possible. This may be accomplished by bandlimiting primarily with resistor R4, i.e. using a larger value of resistance for R4, in situations where hold settling time is important.

The resistor R4 in FIG. 14 interacts with a parasitic capacitance, $C_p$, at the input node of op amp AMP to form a second pole. The frequency of this second pole, $f_2$, is determined by R4 and $C_p$ as follows: $f_2=1/(2\pi R4 \cdot C_p)$. This pole destabilizes op amp AMP. To maintain sufficient stability it is necessary that the value of R4 be kept small with respect to the closed-loop bandwidth, $BW_{AMP}$, of op amp AMP as defined in the following relationship: $R4<<1/(2\pi BW_{AMP}C_p)$. It is, however, also desirable as discussed earlier to have resistance R4 be as large as possible for noise limiting purposes. To maintain sufficient stability, it may be necessary for the value of R4 to be smaller than would otherwise be desired to bandlimit the input noise.

Figure 15:
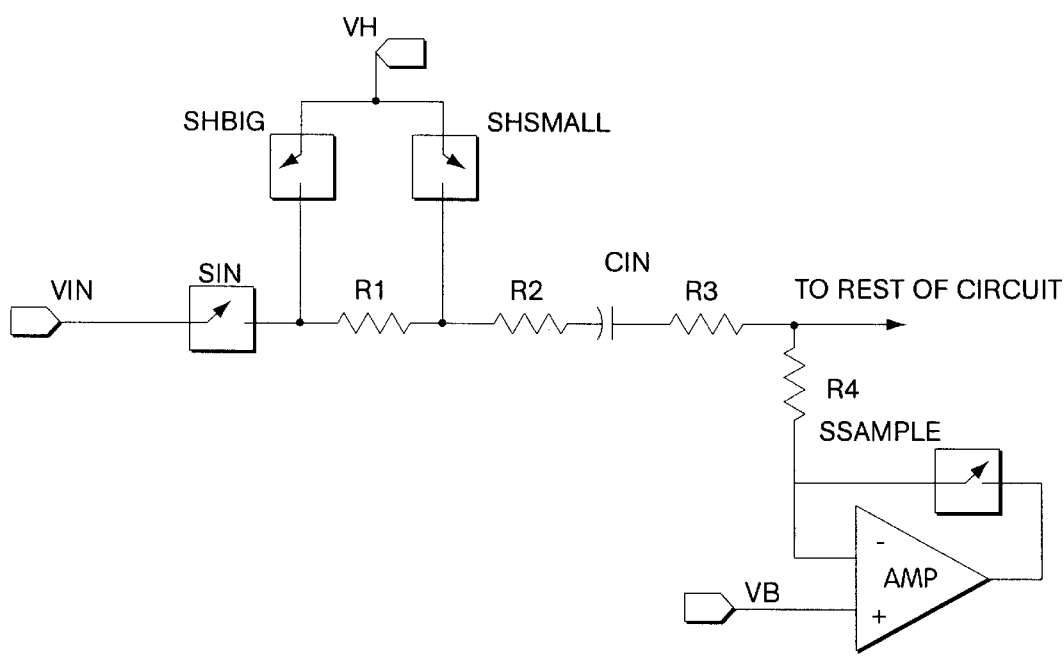

FIG. 15 illustrates another embodiment of the present invention which is useful in situations where hold settling time is important, and where resistance of R4 can not be made high enough to bandlimit the input signal without destabilizing op amp AMP. The embodiment in FIG. 15 is used to further bandlimit the input signal by increasing the value of R1. This embodiment reduces the distortion caused by the interaction of resistor R1 and the nonlinear parasitic capacitances of switch $S_H$ of FIG. 14. The switch $S_H$ in the circuit of FIG. 14 has been divided into two switches, $S_{HBIG}$ and $H_{SMALL}$. Switch $S_{HBIG}$ provides rapid charging of the parasitic capacitances of switch $S_{IN}$ during the hold phase. Similarly, switch $S_{HSMALL}$ permits the rapid charging of $C_{IN}$ to $V_H$ and the transfer of charge from $C_{IN}$ to the rest of the circuit (not shown). The devices used to implement switch $S_{HSMALL}$ should be kept small to minimize nonlinear parasitic capacitances and avoid distortion caused by the interaction of resistor R1 and the parasitic capacitances of switch $S_{HSMALL}$ during sample phase.

Figure 5:
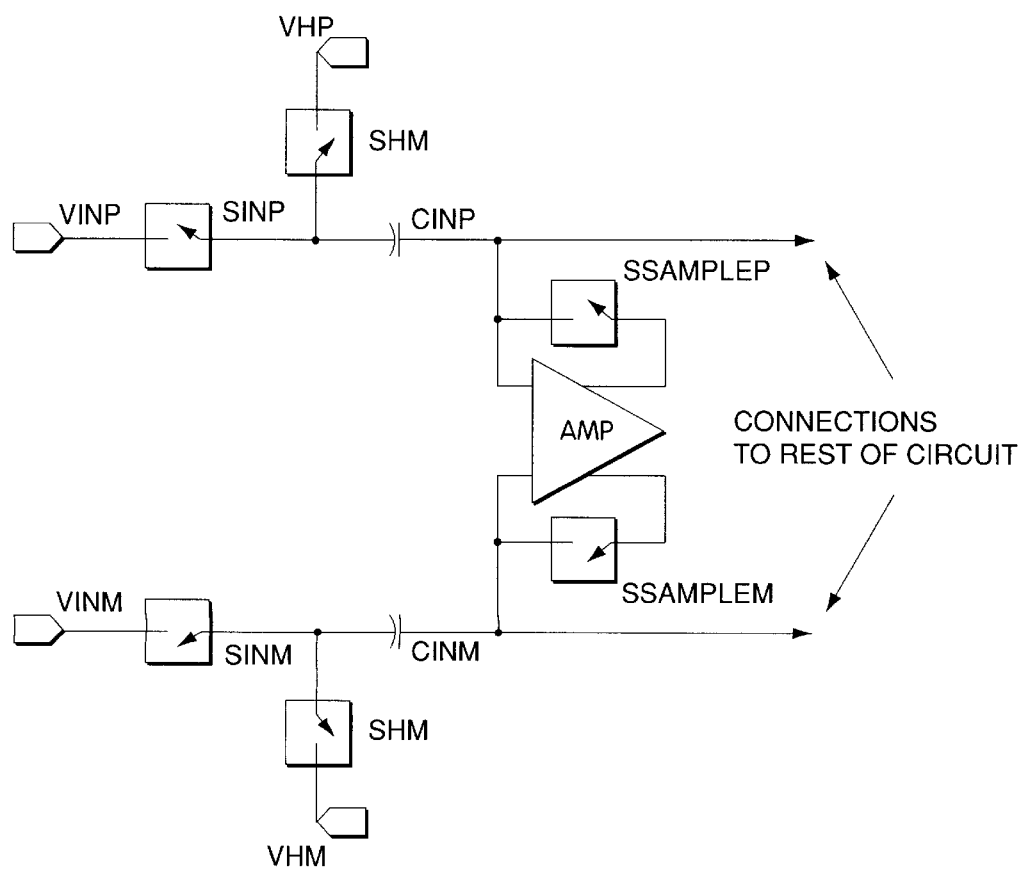
FIG. 5 is a schematic representation of a conventional, differential switched-capacitor input structure similar to the single-ended structure of FIG. 2.
Figure 6:
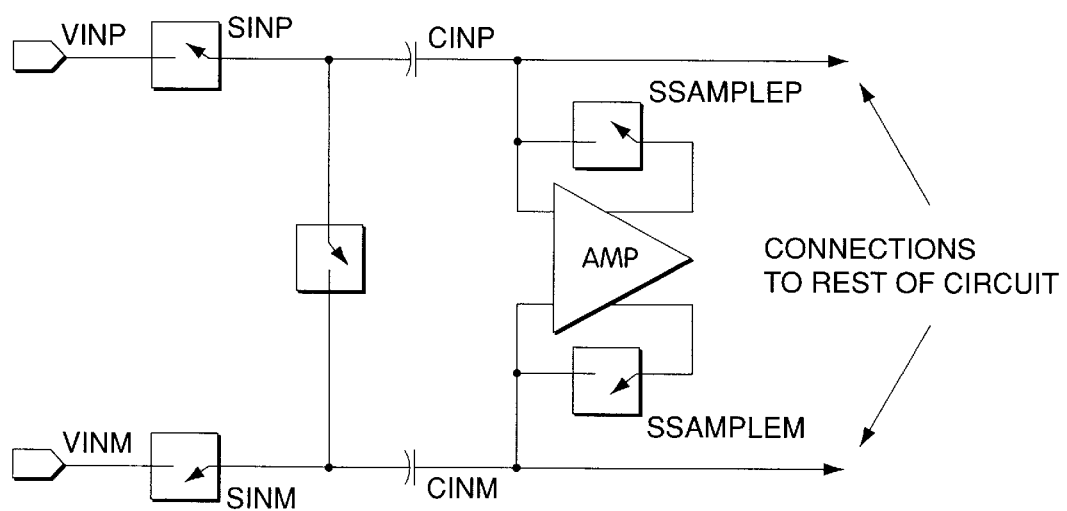
FIG. 6 is a schematic representation of an alternate conventional, differential switched-capacitor input structure.
Figure 7:
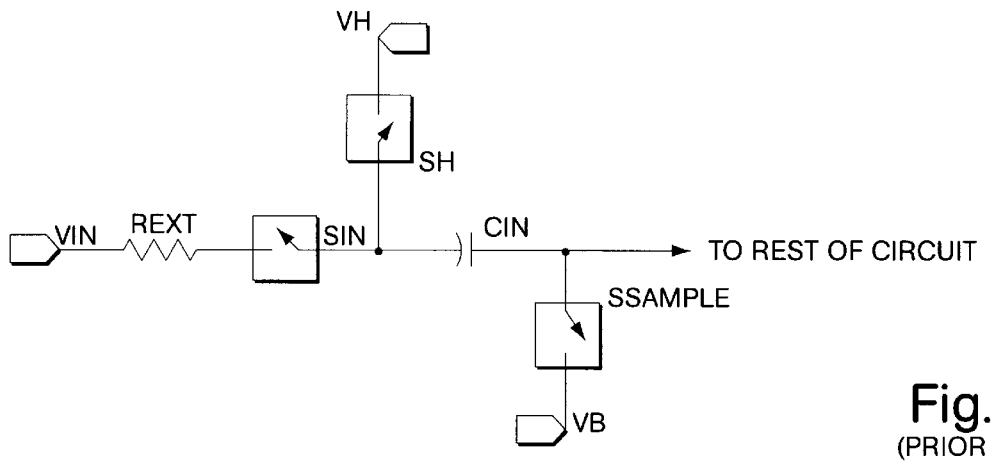
FIG. 7 is a schematic representation of an improved conventional switched-capacitor input structure.
Figure 8:
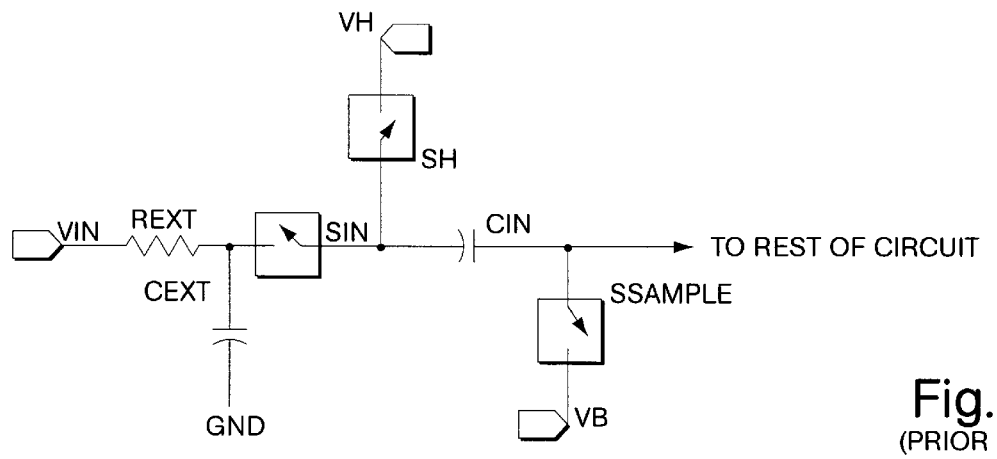
FIG. 8 is a schematic representation of an alternate improved conventional switched-capacitor input structure.
Figure 9:
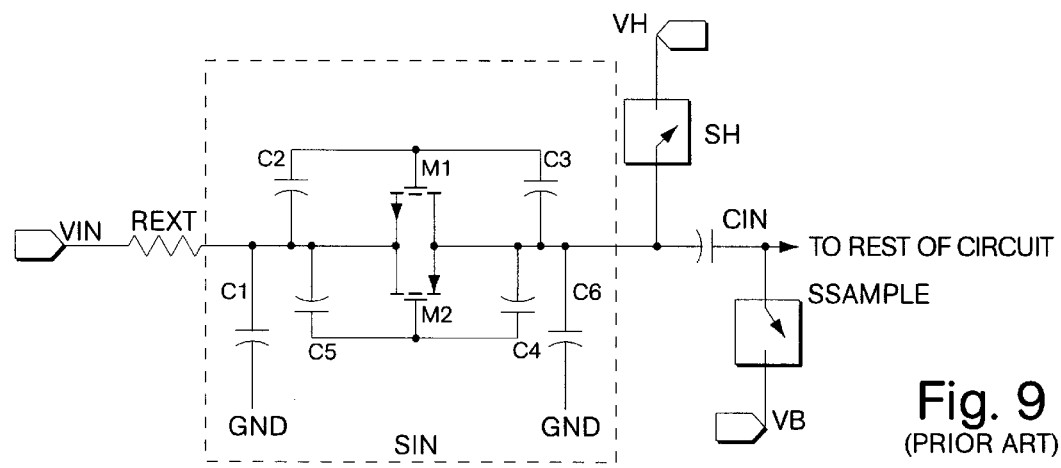
FIG. 9 is a schematic representation of either of the input structures of FIGS. 7 or 8, showing the effects of parasitic capacitances associated with input switch $S_{IN}$.
Figure 16:
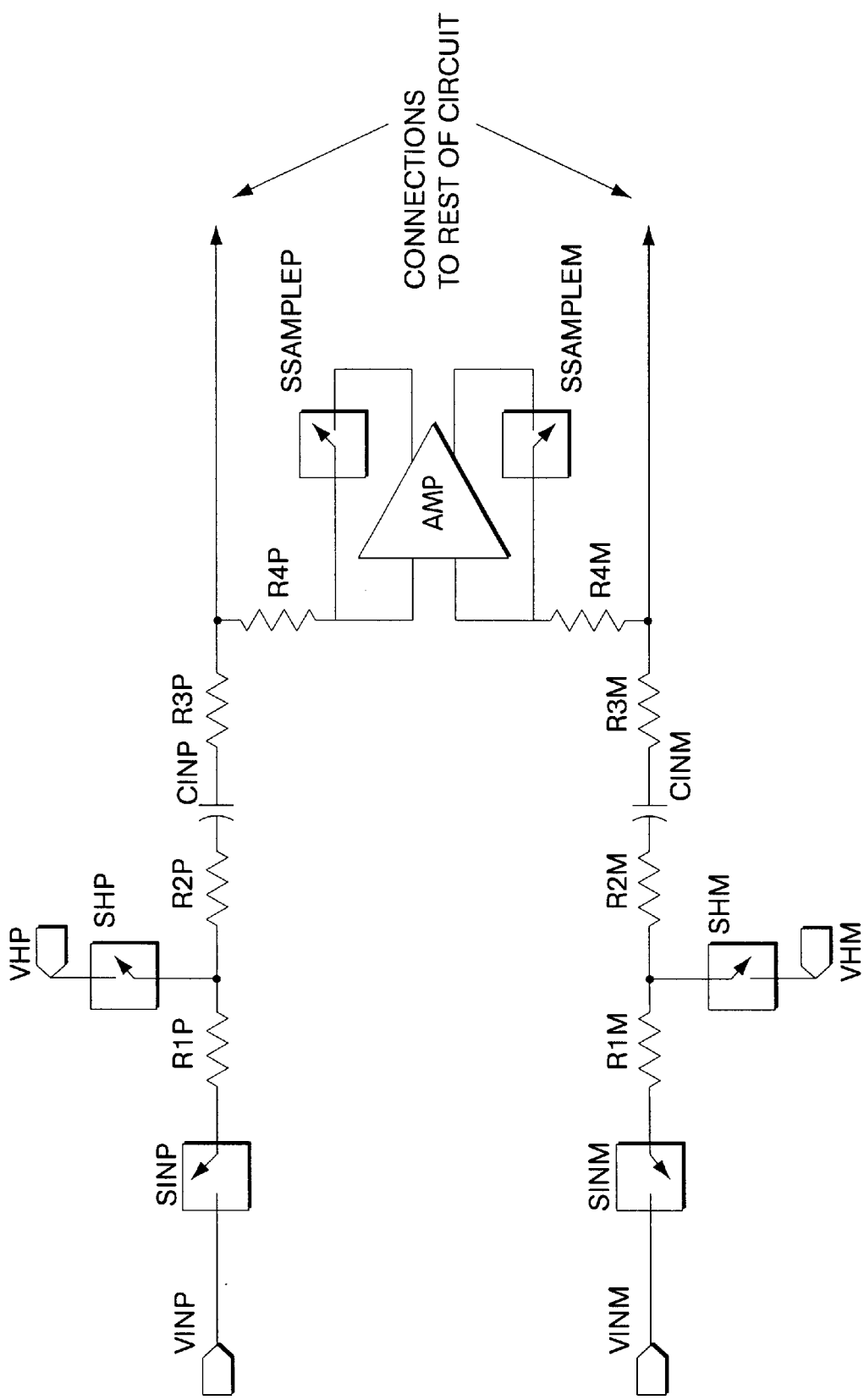

FIG. 16, 17, 18 and 19 illustrate differential embodiments of the invention. FIG. 16 corresponds to prior art FIG. 5, and FIG. 17 corresponds to prior art FIG. 6. Resistors R1P–R4P and R1M–R4M of FIG. 16, 17, 18, and 19 illustrate how bandlimiting resistance can be added to the prior art circuits in FIG. 5 and FIG. 6 to implement differential embodiments of the present invention. Resistors R1P–R4P and R1M–R5M bandlimit both the differential noise and the common-mode noise of the input signal.

Figure 17:
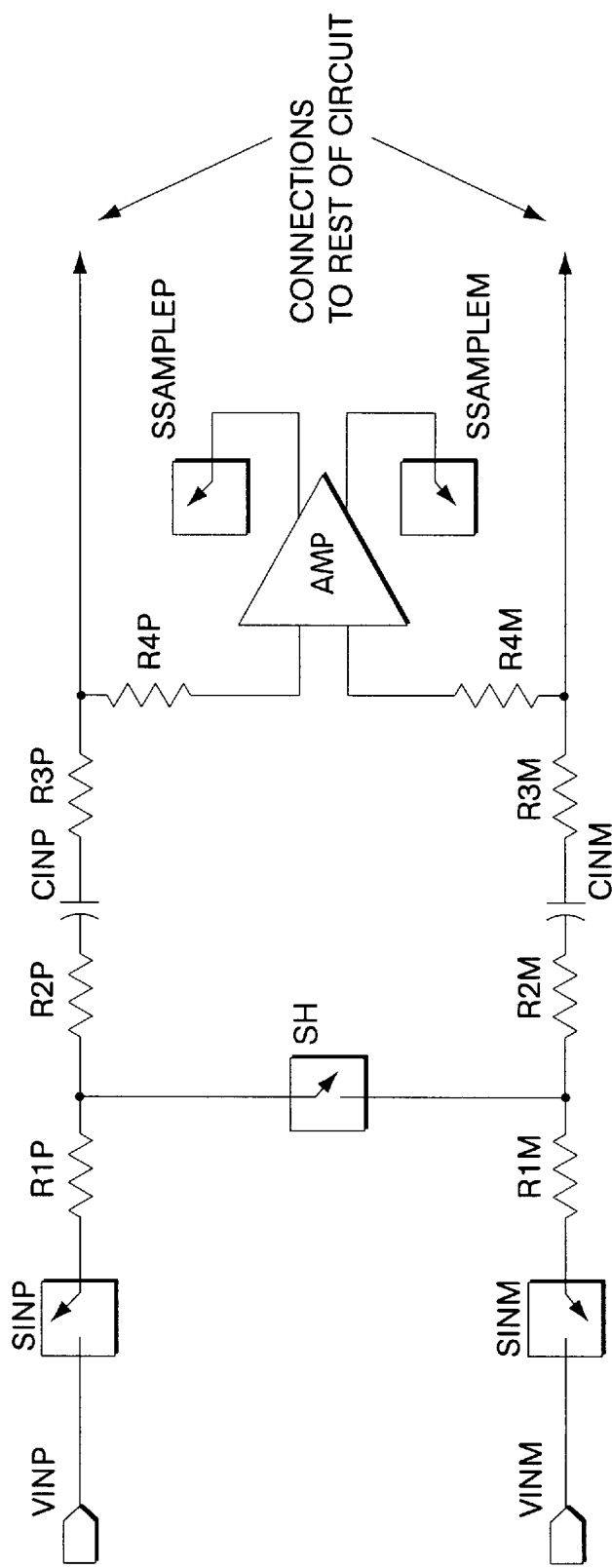

The resistors R4P and R4M in FIG. 16 and in FIG. 17 interact with parasitic capacitance at the input node of op amp AMP to form a second pole. The frequency of this second pole, $f_2$, is determined by R4P, R4M, and the parasitic capacitance as follows: $f_2=1/(2\pi R4 \cdot C_p)$, where R4 represents the value of resistors R4P and R4M and $C_p$ represents the value of the parasitic capacitance between the input terminals of op amp AMP. This pole destabilizes op amp AMP. To maintain sufficient stability it is necessary that R4 be kept small with respect to the closed-loop differential bandwidth, $BW_{AMP}$, of op amp AMP as defined in the following relationship: $R4<<1/(2\pi BW_{AMP}C_p)$. It is, however, also desirable as discussed earlier to have the value, R4, of resistors R4P and R4M be as large as possible for noise limiting purposes. To maintain sufficient stability, it may be necessary for R4 to be smaller than would otherwise be desired to bandlimit the input noise.

Figure 18:
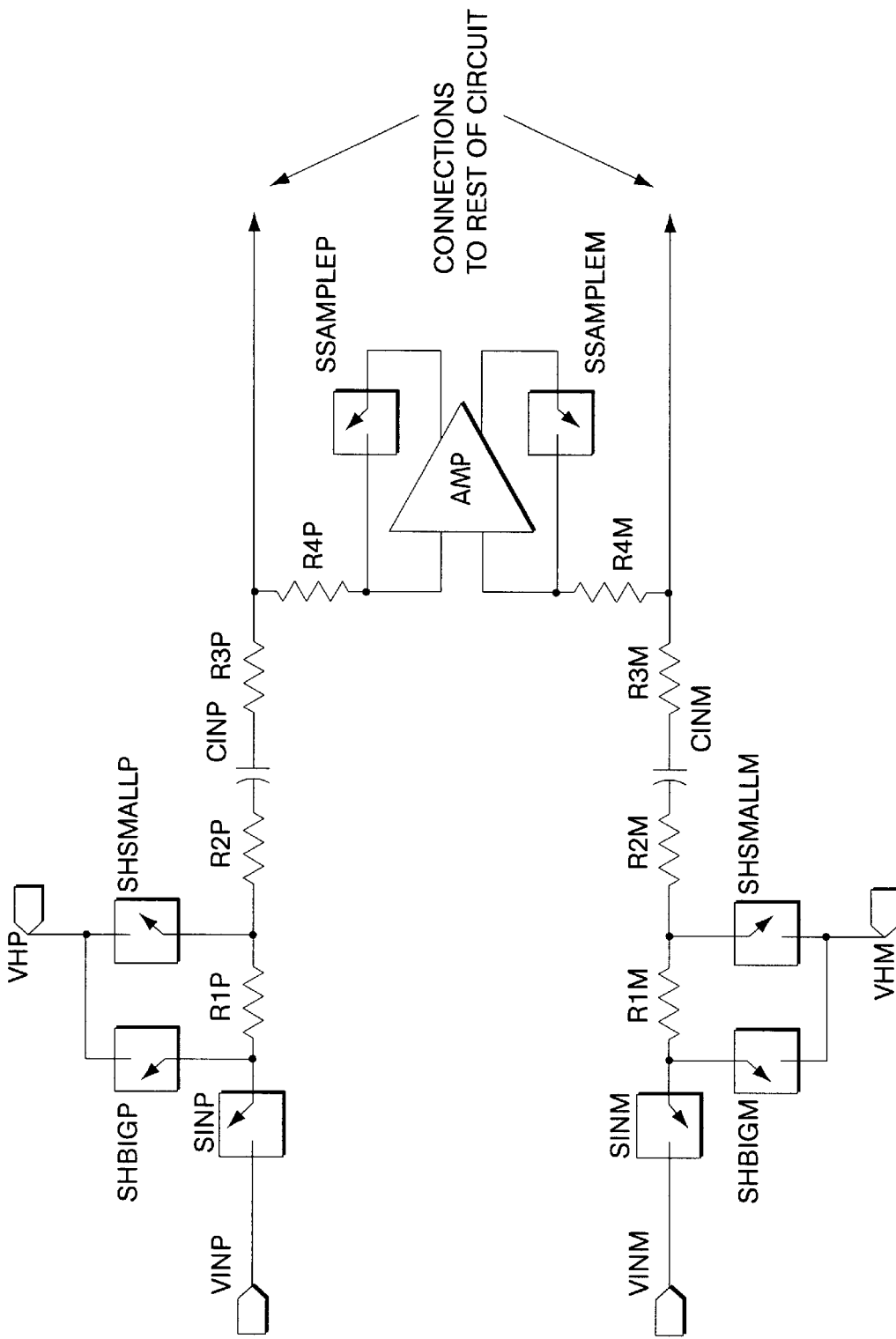
Figure 19:
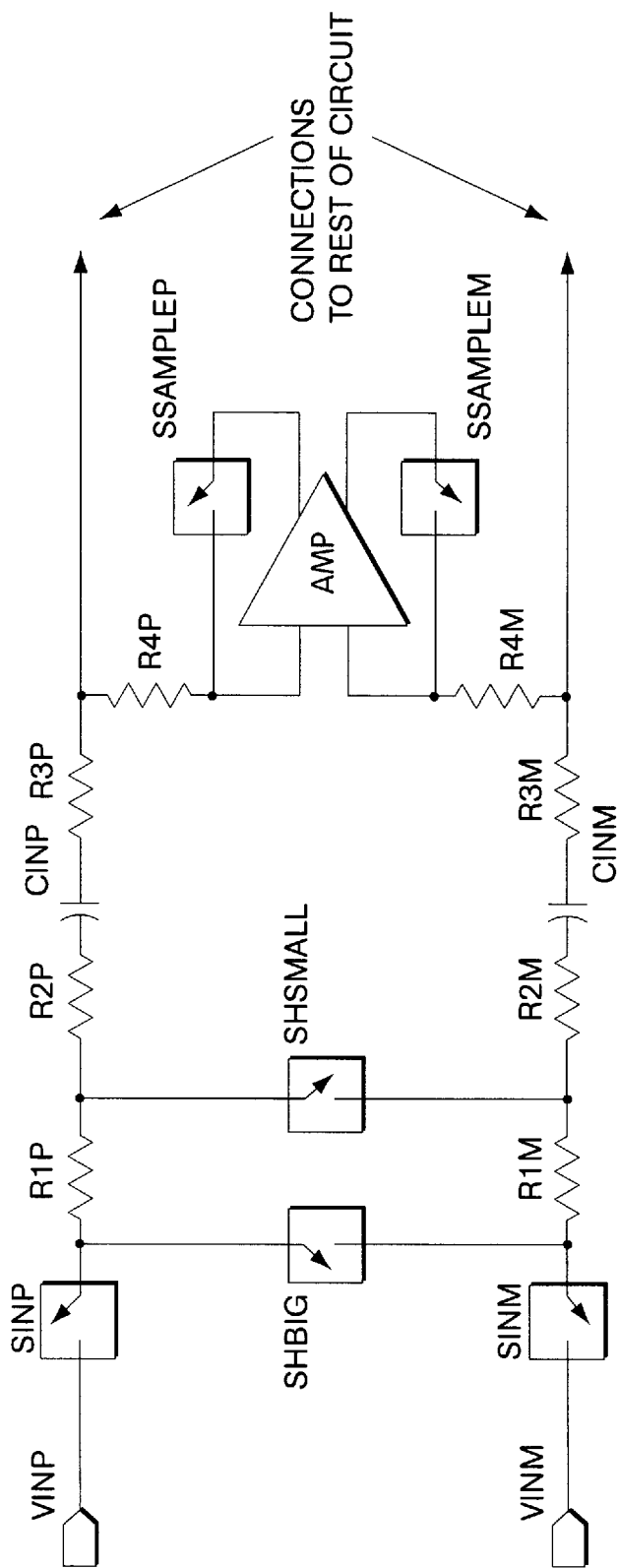

The embodiments of the present invention in FIG. 18 and 19 incorporate the technique employed in the single-ended embodiment of FIG. 15, and are similarly useful in situations where hold settling time is important, and where R4 can not be made high enough to bandlimit the input signal without destabilizing op amp AMP. The embodiment in FIG. 18 and 19 are used to further bandlimit the input signal by increasing the value of R1P and R1M. These two embodiments reduce the distortion caused by the interaction of resistors R1P and R1M with the nonlinear parasitic capacitances of switches $S_{HSMALLP}$ and $S_{HSMALLM}$ in FIG. 18 and switch $S_{HSMALL}$ in FIG. 19.

The embodiments of the present invention in FIG. 18 and 19 incorporate the technique employed in the single-ended embodiment of FIG. 15, and are similarly useful in situations where hold settling time is important. The embodiments of FIG. 18 and 19 reduce hold settling time by bandlimiting with resistor R1P and R1M while avoiding distortion caused by the interaction of resistors R1P and R1M with the nonlinear parasitic capacitances of switches $S_{HSMALLP}$ and $S_{HSMALLM}$ in FIG. 18 and switch $S_{HSMALL}$ in FIG. 19.

The present invention has now been described in connection with a number of specific embodiments thereof. However, numerous modifications which are contemplated as falling within the scope of the present invention should now be apparent to those skilled in the art. For example, the invention relates to the input sampling structure and the circuitry downstream of this input structure is not important. The circuit in which the inventive structure is used could be a sample and hold circuit or an integrator, or other. Therefore, it is intended that the scope of the present invention be limited only by the scope of the claims appended hereto.

We claim:

1. A switched capacitor input sampling structure having an output, comprising:

an input switch having an input and an output;

an input capacitor having a first plate connected to receive a voltage signal from the output of the input switch and having a second plate connected to the output of the input sampling structure;

a low impedance node carrying a reference voltage; and at least one resistor connected in series with the input structure, between the output of the input switch and the low impedance node in a branch of the input structure which bandwidth limits a portion of the input signal appearing between the first plate of the input capacitor and the second plate of the input capacitor, whereby a voltage across the input capacitor remains undistorted.

2. The structure of claim 1, having a sample phase and a hold phase, further comprising:

a first biasing switch connected between the first plate of the input capacitor and a first biasing signal, the first biasing switch conducting during the hold phase and substantially non-conducting during the sample phase; wherein the input switch is conducting during the sample phase and substantially non-conducting during the hold phase.

3. The structure of claim 2, further comprising:

an op amp having an inverting input connected to receive a voltage from the second plate of the input capacitor and having an output; and a sampling switch connected between the output of the op amp and the inverting input of the op amp, the sampling switch conducting during the sample phase and substantially non-conducting during the hold phase.

4. The structure of claim 2, further comprising:

a sampling switch connected to bias the second plate of the input capacitor to a second biasing voltage when the sampling switch is conducting, the sampling switch conducting during the sample phase and substantially non-conducting during the hold phase.

5. The structure of claim 4, wherein the at least one resistor is disposed in a branch of the structure in series between the output of the input sampling structure and the sampling switch.

6. The structure of claim 2, wherein the at least one resistor is disposed in a branch of the structure in series between the input switch and the first plate of the input capacitor.

7. A switched capacitor input sampling structure having an output and having a sample phase and a hold phase, comprising:

an input switch having an input and an output;

an input capacitor having a first plate connected to receive a signal from the output of the input switch and having a second plate connected to the output of the input sampling structure;

at least one resistor connected in series with the input switch, after the output of the input switch;

a first biasing switch connected between the first plate of the input capacitor and a biasing signal, the first biasing switch conducting during the hold phase and substantially non-conducting during the sample phase, wherein the input switch is conducting during the sample phase and substantially non-conducting during the hold phase; and a second biasing switch, having a size substantially larger than that of the first biasing switch, connected between the output of the input switch and the biasing signal, the second biasing switch conducting during the hold phase and substantially non-conducting during the sample phase; and wherein the at least one resistor is connected in a branch of the structure in series between the input switch and the first plate of the input capacitor, whereby a voltage across the input capacitor remains undistorted.

8. A differential switched capacitor input sampling structure having a differential output, having a first branch and a second branch, comprising corresponding ones of:

first and second input switches, each having an input and an output;

first and second input capacitors, each having a first plate connected to receive a signal from the output of a corresponding one of the first and second input switches and each having a second plate, the second plates of the first and second input capacitors forming the differential output;

a low impedance node carrying a reference voltage; and at least one first resistor connected in series with the first branch and the low impedance node and at least one second resistor connected in series with the second branch and the low impedance node, the at least one first resistor and the at least one second resistor connected in branches in the input structure which bandwidth limit a portion of the input signal appearing between the first plate of the input capacitor and the second plate of the input capacitor, whereby voltages across the first and second input capacitors remain undistorted.

9. The structure of claim 8, having a sample phase and a hold phase, further comprising:
   a biasing switch connected between the first plate of the first input capacitor and the first plate of the second input capacitor, the biasing switch conducting during the hold phase and substantially non-conducting during the sample phase; wherein
   the input switch is conducting during the sample phase and substantially non-conducting during the hold phase.

10. The structure of claim 9, further comprising:
   an op amp having an inverting input connected to receive a voltage from the second plate of the first input capacitor, having a non-inverting input connected to receive a voltage from the second plate of the second input capacitor, having a non-inverting output and having an inverting output;
   a first sampling switch connected between the non-inverting output of the op amp and the inverting input of the op amp, the first sampling switch conducting during the sample phase and substantially non-conducting during the hold phase; and
   a second sampling switch connected between the inverting output of the op amp and the non-inverting input of the op amp, the second sampling switch conducting during the sample phase and substantially non-conducting during the hold phase.

11. The structure of claim 10, wherein the at least one first and at least one second resistors are connected in corresponding branches of the structure in series between corresponding outputs of the input sampling structure and corresponding sampling switches.

12. The structure of claim 9, wherein the at least one first and at least one second resistors are disposed in branches of the structure in series between corresponding first and second input switches and the first plate of corresponding input capacitors.

13. A differential switched capacitor input sampling structure having a differential output, having a first branch and a second branch and having a sample phase and a hold phase, comprising corresponding ones of:
   first and second input switches, each having an input and an output;
   first and second input capacitors, each having a first plate connected to receive a signal from the output of a corresponding one of the first and second input switches and each having a second plate, the second plates of the first and second input capacitors forming the differential output;
   at least one first resistor and at least one second resistor, each connected in series with corresponding ones of the first and second branches;
   a biasing switch connected between the first plate of the first input capacitor and the first plate of the second input capacitor, the biasing switch conducting during the hold phase and substantially non-conducting during the sample phase, wherein the input switch is conducting during the sample phase and substantially non-conducting during the hold phase; and
   a second biasing switch, of a size substantially larger than that of the first biasing switch, connected between the output of the first input switch and the output of the second input switch, the second biasing switch conducting during the hold phase and substantially non-conducting during the sample phase; and wherein
   the at least one first resistor and at least one second resistor are disposed in branches of the structure in series between corresponding first and second input switches and the first plate of corresponding input capacitors, whereby voltages across the first and second input capacitors remain undistorted.

14. A differential switched capacitor input sampling structure having a differential output, having a first branch and a second branch, comprising corresponding ones of:
   first and second input switches, each having an input and an output;
   first and second input capacitors, each having a first plate connected to receive a signal from the output of a corresponding one of the first and second input switches and each having a second plate, the second plates of the first and second input capacitors forming the differential output;
   first and second sampling switches connected to bias the second plate of corresponding ones of the first and second input capacitors each to a biasing signal when the first and second sampling switches are conducting, the first and second sampling switches conducting during the sample phase and substantially non-conducting during the hold phase;
   a low impedance node carrying a reference voltage; and
   at least one first resistor connected in series with the first branch and the low impedance node and at least one second resistor connected in series with the second branch and the low impedance node, the at least one first resistor and the at least one second resistor connected in branches in the input structure which bandwidth limit a portion of the input signal appearing between the first plate of the input capacitor and the second plate of the input capacitor, whereby voltages across the first and second input capacitors remain undistorted.

15. The structure of claim 14, further comprising:
   first and second biasing switches connected respectively between the first plate of the first and second input capacitors and first and second biasing signals, the biasing switch conducting during the hold phase and substantially non-conducting during the sample phase.

16. A switched capacitor input sampling structure having an input and an output, comprising:
   a capacitor connected in series between the input and the output;
   an input switch connected to transfer a voltage signal from the input to one side of the capacitor;
   a sampling switch connected to cause transfer of a biasing voltage to another side of the capacitor; and
   at least one resistor connected in a branch of the input sampling structure between the input switch and the output, the branch selected to limit bandwidth of a portion of the signal appearing between one side of the capacitor and other side of the capacitor, and the branch further selected to preserve undistorted a voltage across the capacitor.

17. The structure of claim 16, wherein the biasing voltage is produced at a virtual ground node of a voltage follower circuit.

18. The structure of claim 16, wherein the at least one resistor is in series between the input switch and the capacitor.

19. The structure of claim 16, wherein the at least one resistor is in series between the capacitor and the output.

20. The structure of claim 17, wherein the at least one resistor is in series between the output and the virtual ground node.

21. The structure of claim 16, wherein the at least one resistor is in series between the output and a source of the biasing voltage.

22. The structure of claim 21, wherein the at least one resistor is in series between the sampling switch and the source of the biasing voltage.

23. A switched capacitor input sampling structure having an input and output, comprising:

a capacitor connected in series between the input and the output, having a first plate and a second plate;

an input switch connected to apply a voltage at the input to the first plate;

a circuit which causes the second plate to receive a reference voltage while the voltage at the input is applied to the first plate, the capacitor having defined there across a sample voltage; and at least one resistor connected after the input switch so as to bandwidth limit charging the capacitor to the sample voltage, while preserving undistorted the sample voltage.

24. The structure of claim 23, wherein the circuit includes a sampling switch through which the reference voltage is applied to the second plate.

25. The structure of claim 24, wherein the at least one resistor is in series between the input switch and the capacitor.

26. The structure of claim 24, wherein the at least one resistor is in series between the capacitor and the output.

27. The structure of claim 24, wherein the at least one resistor is in series between the output and a source of the biasing voltage.

28. The structure of claim 27, wherein the at least one resistor is in series between the sampling switch and the source of the biasing voltage.

29. The structure of claim 23, wherein the reference voltage is produced at a virtual ground node of a voltage follower circuit.

30. The structure of claim 29, wherein the at least one resistor is in series between the output and the virtual ground node.

31. A switched capacitor input sampling structure having an input and an output, comprising:

a capacitor connected in series between the input and the output;

means including an input switch connected between the input and the capacitor for applying to the capacitor a voltage substantially equal to a voltage at the input, less a reference voltage; and resistive means connected after the input switch for limiting bandwidth of the voltage applied to the capacitor, and for preserving undistorted the voltage applied to the capacitor.

32. The structure of claim 31, the resistive means further comprising:

at least one resistor connected between the input switch and the capacitor.

33. The structure of claim 31, having a node carrying the reference voltage, the resistive means further comprising:

at least one resistor connected between the input switch and the node carrying the reference voltage.

34. The structure of claim 33, the at least one resistor connected between the capacitor and the node carrying the reference voltage.

35. A differential switched capacitor input sampling structure having a differential output, having a first branch and a second branch, comprising corresponding ones of:

first and second input switches, each having an input and an output;

first and second input capacitors, each having a first plate connected to receive a signal from the output of a corresponding one of the first and second input switches and each having a second plate, the second plates of the first and second input capacitors forming the differential output;

a sampling switch connected between the second plates of the first and second input capacitors; and at least one resistor connected in series with the sampling switch and between the second plates of the first and second input capacitors, whereby voltages across the first and second input capacitors remains undistorted.

* * * * *

UNITED STATES PATENT AND TRADEMARK OFFICE
CERTIFICATE OF CORRECTION

PATENT NO. : 5,909,131
DATED : June 1, 1999
INVENTOR(S) : Lawrence A. Singer, et. al.

It is certified that error appears in the above-identified patent and that said Letters Patent is hereby corrected as shown below:

Replace the original Fig. 17 with the corrected Fig. 17 shown below:

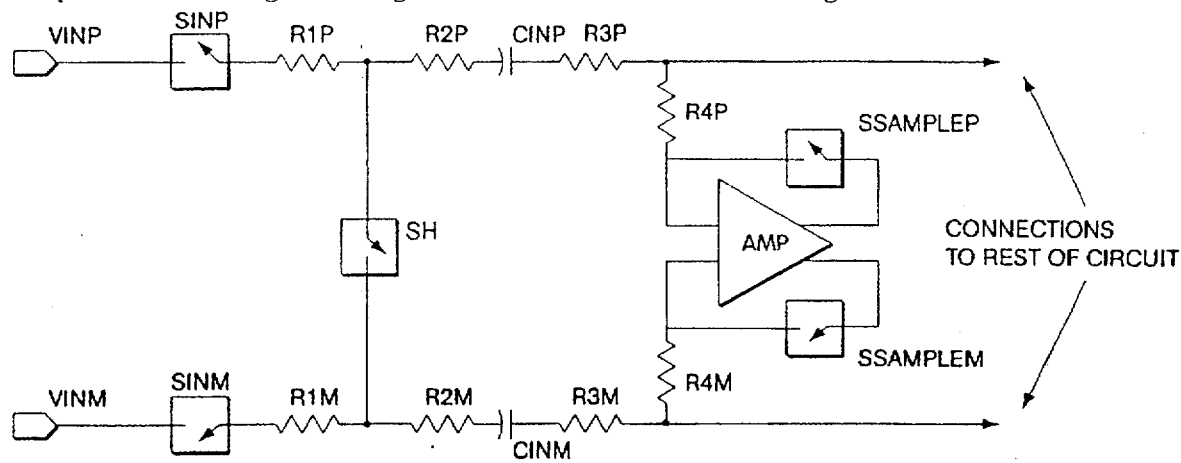

Signed and Sealed this

Thirtieth Day of November, 1999

*Attest:*

Q. TODD DICKINSON

*Attesting Officer*   *Acting Commissioner of Patents and Trademarks*